(12) United States Patent
Kitagawa et al.

(10) Patent No.: US 10,803,923 B2
(45) Date of Patent: Oct. 13, 2020

(54) APPARATUSES AND METHODS FOR PROVIDING CLOCK SIGNALS IN A SEMICONDUCTOR DEVICE

(71) Applicant: Micron Technology, Inc., Boise, ID (US)

(72) Inventors: Katsuhiro Kitagawa, Hachioji (JP); Kazuhiro Kurihara, Tokyo (JP); Kohei Nakamura, Fuchu (JP); Akira Yamashita, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/444,365

(22) Filed: Jun. 18, 2019

(65) Prior Publication Data

US 2019/0304532 A1    Oct. 3, 2019

Related U.S. Application Data

(63) Continuation of application No. 15/937,552, filed on Mar. 27, 2018, now Pat. No. 10,339,998.

(51) Int. Cl.
| | |
|---|---|
| G11C 11/4076 | (2006.01) |
| H03K 5/1534 | (2006.01) |
| H03K 5/05 | (2006.01) |
| H03K 3/037 | (2006.01) |
| H03K 5/135 | (2006.01) |
| G11C 7/22 | (2006.01) |
| H03K 5/15 | (2006.01) |
| H03K 5/00 | (2006.01) |

(52) U.S. Cl.
CPC .......... *G11C 11/4076* (2013.01); *G11C 7/222* (2013.01); *H03K 3/037* (2013.01); *H03K 5/05* (2013.01); *H03K 5/135* (2013.01); *H03K 5/1506* (2013.01); *H03K 5/1534* (2013.01); *H03K 2005/00286* (2013.01)

(58) Field of Classification Search
CPC .................................................... G11C 11/4076
USPC .................................................. 327/254, 291
See application file for complete search history.

(56) References Cited

U.S. PATENT DOCUMENTS

| | | |
|---|---|---|
| 5,705,942 A | 1/1998 | Ashuri |
| 2002/0116423 A1 | 8/2002 | Bredin et al. |
| 2006/0044891 A1 | 3/2006 | Lin et al. |
| 2006/0092929 A1 | 5/2006 | Chun |

(Continued)

OTHER PUBLICATIONS

U.S. Appl. No. 16/156,862, titled "Apparatuses and Methods for Providing Voltages to Conductive Lines Between Which Clock Signal Lines Are Disposed" filed Oct. 10, 2018.

(Continued)

*Primary Examiner* — Tomi Skibinski
(74) *Attorney, Agent, or Firm* — Dorsey & Whitney LLP

(57) ABSTRACT

Apparatuses and methods for providing clocks in a semiconductor device are disclosed. An example apparatus includes a clock generating circuit configured to generate an output clock signal based on one of rising and trailing edges of first, second, third and fourth clock signals in a first mode, phases of the first, second, third and fourth clock signals being shifted to each other. The clock generating circuit is further configured to generate the output clock signal based on both of rising and trailing edges of fifth and sixth clock signals in a second mode.

20 Claims, 10 Drawing Sheets

(56) References Cited

U.S. PATENT DOCUMENTS

| | | | |
|---|---|---|---|
| 2006/0244503 A1* | 11/2006 | Lee | G06F 1/04 |
| | | | 327/291 |
| 2008/0001638 A1* | 1/2008 | Choi | G11C 7/1051 |
| | | | 327/117 |
| 2009/0114994 A1 | 5/2009 | Kim | |
| 2010/0301906 A1 | 12/2010 | De et al. | |
| 2015/0293556 A1* | 10/2015 | Chang | G06F 1/08 |
| | | | 327/291 |

OTHER PUBLICATIONS

U.S. Appl. No. 16/436,655 titled "Apparatuses and Methods for Providing Voltages to Conductive Lines Between Which Clock Signal Lines Are Disposed" filed Jun. 10, 2019.

U.S. Appl. No. 15/937,552 entitled 'Apparatuses and Methods for Providing Clock Signals in a Semiconductor Device' filed Mar. 27, 2018.

\* cited by examiner

APPARATUSES AND METHODS FOR PROVIDING CLOCK SIGNALS IN A SEMICONDUCTOR DEVICE

CROSS-REFERENCE TO RELATED APPLICATION

This application is a continuation of U.S. patent application Ser. No. 15/937,552 filed on Mar. 27, 2018 and issued as U.S. Pat. No. 10,339,998 on Jul. 2, 2019. This application and patent are incorporated by reference herein in their entirety and for all purposes.

BACKGROUND

Semiconductor memories are used in many electronic systems to store data that may be retrieved at a later time. As the demand has increased for electronic systems to be faster, have greater data capacity, and consume less power, semiconductor memories that may be accessed faster, store more data, and use less power have been continually developed to meet the changing needs. Part of the development includes creating new specifications for controlling and accessing semiconductor memories, with the changes in the specifications from one generation to the next directed to improving performance of the memories in the electronic systems.

Semiconductor memories are generally controlled by providing the memories with command signals, address signals, clock signals. The various signals may be provided by a memory controller, for example. The command signals may control the semiconductor memories to perform various memory operations, for example, a read operation to retrieve data from a memory, and a write operation to store data to the memory. The data may be provided between the controller and memories with known timing relative to receipt by the memory of an associated command. The known timing is typically defined by latency information. The latency information may be defined by numbers of clock cycles of system clock signals CK and CKF.

With newly developed memories, the memories may be provided with system clock signals that are used for timing the command signals and address signals, for example, and further provided with data clock signals that are used for timing the read data provided by the memory and for timing the write data provided to the memory. The memories may also provide clock signals to the controller for timing the provision of data provided to the controller. The clock signals provided to the memories may also change clock frequencies, for example, have a relatively high clock frequency when higher speed operation is desirable, and have a relatively low clock frequency when lower speed operation is acceptable.

The clock signals provided to the memories are used to provide internal clocks that control the timing of various circuits during operation. The timing of the circuits during operation may be critical, and deviations in the timing of the clock signals may cause erroneous operation. This may especially be the case for higher frequency clock signals where even relatively small timing deviations can create problems.

Timing deviations may be corrected by using circuits that adjust clock signal timing to provide internal clock signals having reduced timing deviation. However, these circuits are typically complex and consume significant power when operating. In low power applications where reduced power consumption is a priority, the power consumed by such circuits may be undesirable. As a result, alternative approaches for providing internal clock signals with reduced timing deviation while reducing power consumption may be desirable.

DETAILED DESCRIPTION

Certain details are set forth below to provide a sufficient understanding of examples of the disclosure. However, it will be clear to one having skill in the art that examples of the disclosure may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring embodiments of the disclosure. Additionally, terms such as "couples" and "coupled" mean that two components may be directly or indirectly electrically coupled. Indirectly coupled may imply that two components are coupled through one or more intermediate components.

Figure 1:
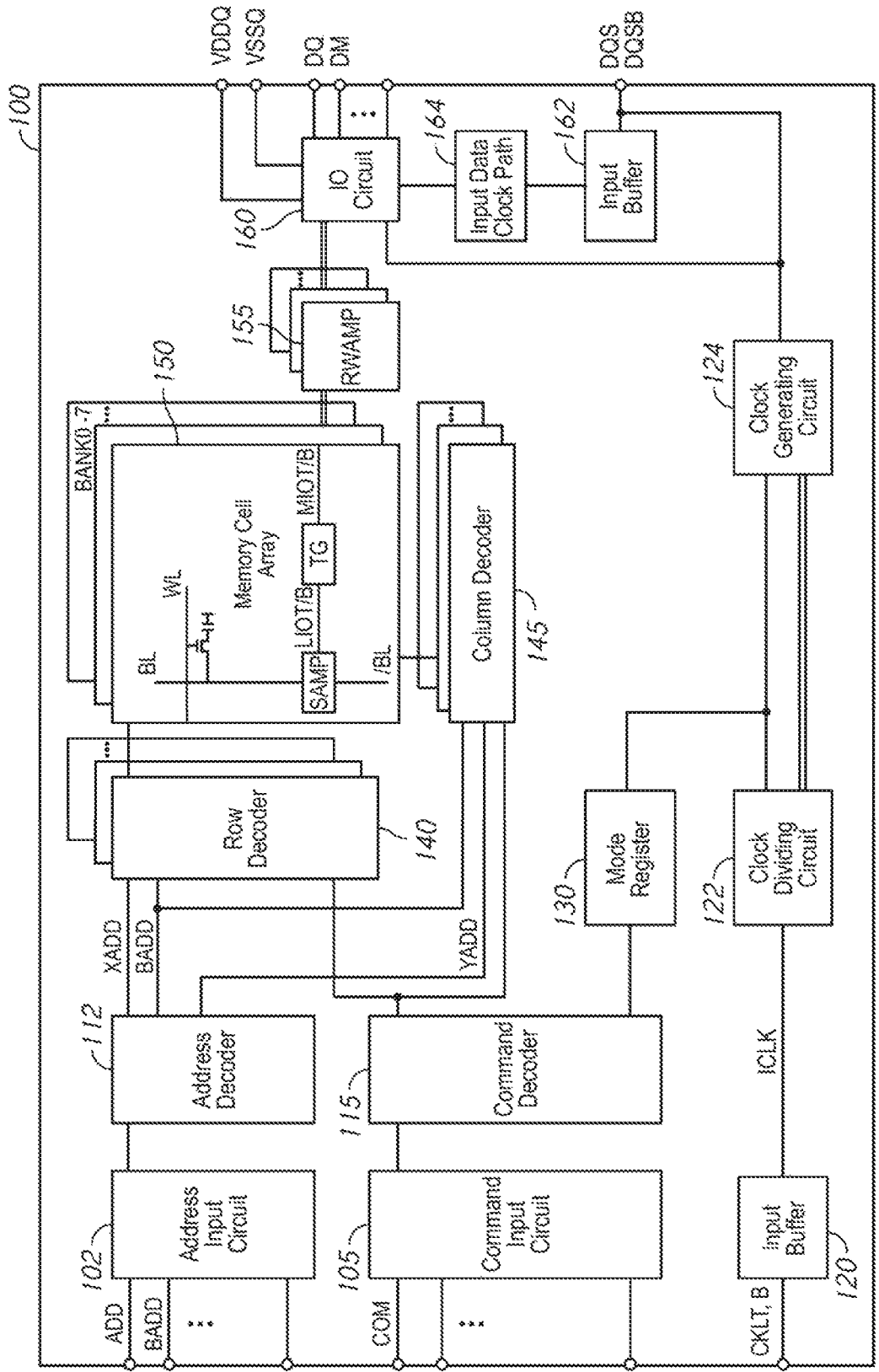
FIG. 1 is a block diagram of an apparatus according to an embodiment of the disclosure.

FIG. 1 is a block diagram of an apparatus according to an embodiment of the disclosure. The apparatus may be a semiconductor device 100, and will be referred as such. In some embodiments, the semiconductor device 100 may include, without limitation, a DRAM device, such as low power DDR (LPDDR) memory integrated into a single semiconductor chip, for example. The semiconductor device 100 includes a memory array 150. The memory array 150 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder 140 and the selection of the bit line BL is performed by a column decoder 145. Sense amplifiers (SAMP) are located for their corresponding bit lines BL and connected to at least one respective local I/O line pair (LIOT/B), which is in turn coupled to at least respective one main I/O line pair (MIOT/B), via transfer gates (TG), which function as switches.

The semiconductor device 100 may employ a plurality of external terminals that include command terminals and address terminals coupled to a command bus and an address bus to receive commands COM and addresses ADD and BADD, clock terminals to receive clock signals CLKT and CLKB, strobe clock terminals to provide or receive strobe clock signals DQS and DQSB, data terminals DQ and DM, and power supply terminals VDDQ and VSSQ.

The address terminals may be supplied with an address ADD and a bank address BADD, for example, from a memory controller. The address ADD and the bank address BADD supplied to the address terminals are transferred, via an address input circuit 102, to an address decoder 112. The address decoder 112 receives the address and supplies a decoded row address XADD to the row decoder 140, and a decoded column address YADD to the column decoder 145. The address decoder 112 also receives the bank address and supplies a decoded bank address BADD to the row decoder 140 the column decoder 145.

The command terminals may be supplied with command COM from, for example, a memory controller. The command may be provided as internal command signals to a command decoder 115 via the command input circuit 105. The command decoder 115 includes circuits to decode the internal command signals to generate various internal signals and commands for performing operations. For example, the command decoder 115 may provide a row command signal to select a word line and a column command signal to select a bit line. The command decoder 115 also accesses a mode register 130 that stores information for setting various modes and features of operation for the semiconductor device 100. For example, the mode register 130 may store information for modes related to generating strobe clock signals DQS and DQSB from the CLKT and CLKB clock signals that are provided by the semiconductor device 100 (e.g., for read operations), and/or related to generating internal clock signals to time the operation of circuits when strobe signals DQS and DQSB are provided to the semiconductor device 100 (e.g., for write operations). The information stored by the mode register 130 may be programmed by providing the information to the semiconductor device 100.

When a read command is received and a row address and a column address are timely supplied with the read command, read data is read from a memory cell in the memory array 150 designated by the row address and column address. The read command is received by the command decoder 115, which provides internal commands to input/output circuit 160 so that read data is output to outside from the data terminals DQ via read/write amplifiers 155, and strobe clock signals DQS and DQSB are provided to outside from the strobe clock terminals.

When the write command is received and a row address and a column address are timely supplied with this command, then write data is supplied to the data terminals DQ according to the DQS and DQSB strobe clock signals. A data mask may be provided to the data terminals DM to mask portions of the data when written to memory. The write command is received by the command decoder 115, which provides internal commands to the input/output circuit 160 so that the write data is received by data receivers in the input/output circuit 160, and supplied via the input/output circuit 160 and the read/write amplifiers 155 to the memory array 150. The write data is written in the memory cell designated by the row address and the column address.

The clock terminals and data clock terminals are supplied with external clock signals. The external clock signals CLKT and CLKB are supplied to an input buffer 120 from a memory controller. The CLKT and CLKB clock signals are complementary. The input buffer 120 generates an internal clock signal ICLK based on the CLKT and CLKB clock signals. The ICLK is provided to a clock dividing circuit 122.

The clock dividing circuit 122 provides various phase and frequency controlled internal clock signals based on the ICLK clock signal. The internal clock signals may be multiphase clock signals that have phase relationship with one another. A control signal MODE from the mode register 130 causes the clock dividing circuit 122 to operate in different modes, for example, providing four multiphase clock signals in a first mode and providing two multiphase clock signals in a second mode. The internal clock signals may have a lower clock frequency than the ICLK clock signal (and the CLKT and CLKB clock signals). For example, in some embodiments of the disclosure, the internal clock signals have half the clock frequency of the ICLK clock signal. The internal clock signals are provided by the clock dividing circuit 122 over clock buses to a clock generating circuit 124.

The clock generating circuit 124 provides strobe clock signals DQS and DQSB based on the internal clock signals from the clock dividing circuit 122. The strobe clock signals DQS and DQSB have a clock frequency higher than the clock frequency of the internal clock signals from the clock dividing circuit 122. In some embodiments of the disclosure, the strobe clock signals DQS and DQSB have twice the clock frequency of the internal clock signals (and the same frequency as the ICLK clock signal and the CLKT and CLKB clock signals). As a result, the ICLK clock signal and the DQS and DQSB clock signals are transferred at a first clock frequency and the internal clock signals are transferred in a second clock frequency that is one half of the first clock frequency.

The clock generating circuit 124 is provided the MODE signal from the mode register 130 to control a mode of operation. For example, in a first mode the clock generating circuit 124 provides the strobe clock signals DQS and DQSB based on a first set of internal clock signals from the clock dividing circuit 122, and in a second mode the clock generating circuit 124 provides the strobe clock signals DQS and DQSB based on a second set of internal clock signals from the clock dividing circuit 122. Providing strobe clock signals DQS and DQSB based on one of the two sets of internal clock signals may consume less power compared to providing the strobe clock signals DQS and DQSB based on the other set of internal clock signals. However, the strobe clock signals DQS and DQSB based on the one of the two sets of internal clock signals may have less timing accuracy compared to strobe clock signals DQS and DQSB based on the other set of internal clock signals. The clock generating circuit 124 may further provide multiphase clock signals to the input/output circuit 160 for controlling an output timing of read data.

An input buffer 162 receives strobe clock signals that are provided to the semiconductor device, for example, for a write operation. The input buffer 162 provides an internal strobe clock signal iDQS based on the received strobe clock signals to an input data clock path 164. The input data clock path 164 provides multiphase clock signals to the input/output circuit 160 for controlling an input timing of write data.

The power supply terminals are supplied with power supply potentials VDDQ and VSSQ. The power supply potentials VDDQ and VSSQ are supplied to the input/output circuit 160. The power supply potentials VDDQ and VSSQ are used for the input/output circuit 160 so that power supply noise generated by the input/output circuit 160 does not propagate to the other circuit blocks.

Figure 2:
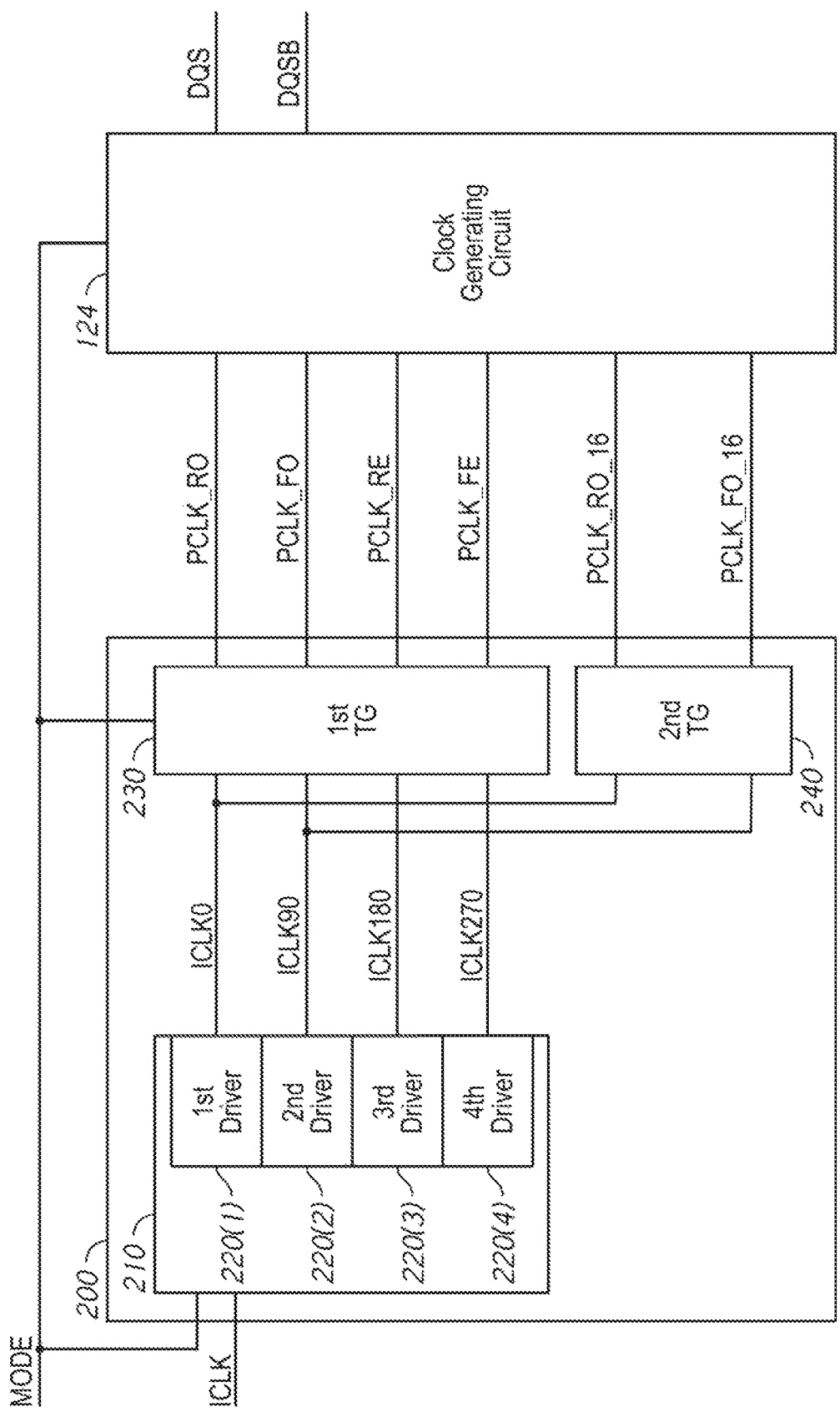
FIG. 2 is a block diagram of a clock dividing circuit according to an embodiment of the disclosure.

FIG. 2 is a block diagram of a clock dividing circuit 200 according to an embodiment of the disclosure. The clock dividing circuit 200 may be including in the clock dividing circuit 122 of the semiconductor 100 (FIG. 1) in some embodiments of the disclosure.

The clock dividing circuit 200 includes a divider circuit 210 that receives an input clock signal ICLK and a control signal MODE. The divider circuit 210 includes driver circuits 220(1), 220(2), 220(3) and 220(4) that provide respective clock signals ICLK0, ICLK90, ICLK180, and ICLK270. The ICLK0, ICLK90, ICLK180, and ICLK270 clock signals may be multiphase clock signals that have a common relative phase to one another. For example, in an embodiment of the disclosure, the ICLK0, ICLK90, ICLK180, ICLK270 clock signals have a relative phase of 90 degrees to one another. For example, the ICLK90 clock signal is shifted in phase by 90 degrees relative to the ICLK0 clock signal, the ICLK180 clock signal is shifted in phase by 180 degrees relative to the ICLK0 clock signal (and shifted in phase by 90 degrees relative to the ICLK90 clock signal), and the ICLK270 clock signal is shifted in phase by 270 degrees relative to the ICLK0 clock signal (and shifted in phase by 90 degrees relative to the ICLK180 clock signal). In such a case, the multiphase clock signals ICLK0, ICLK90, ICLK180, ICLK270 may be referred to as "quadrature" phase clock signals. The ICLK0, ICLK90, ICLK180, and ICLK270 clock signals provided by the divider circuit 210 may also have a lower clock frequency than the ICLK clock signal. For example, in some embodiments of the disclosure, the ICLK0, ICLK90, ICLK180, and ICLK270 clock signals have one-half the clock frequency of the ICLK clock signal.

The divider circuit 210 provides the ICLK0, ICLK90, ICLK180, and ICLK270 clock signals responsive to the ICLK clock signal when the MODE signal has a first logic level (e.g., a first mode). The clock divider circuit 210 provides the ICLK0 and ICLK90 clock signals responsive to the ICLK clock signal when the MODE signal has a second logic level (e.g., second mode). For example, the driver circuits 220(1), 220(2), 220(3), and 220(4) may be activated responsive to the MODE signal having the first logic level to provide the respective ICLK0, ICLK90, ICLK180, and ICLK270l clock signals. In contrast, the driver circuits 220(1) and 220(2) may be activated responsive to the MODE signal having the second logic level to provide the ICLK0 and ICLK90 clock signals.

The divider circuit 210 provides ICLK0, ICLK90, ICLK180, and ICLK270 clock signals to a transfer gate 230, and provides the ICLK0 and ICLK90 clock signals to a transfer gate 240. The transfer gate 240 is deactivated and the transfer gate 230 is activated to provide the ICLK0, ICLK90, ICLK180, and ICLK270 clock signals as the PCLK_RO, PCLK_FO, PCLK_RE, and PCLK_FE clock signals, respectively, by the MODE signal having the first logic level (e.g., the first mode). In contrast, when the MODE signal has the second logic level (e.g., the second mode), the transfer gate 230 is deactivated and the transfer gate 240 is activated to provide the ICLK0 and ICLK90 clock signals as the PCLK_RO_16 and PCLK_FO_16 clock signals, respectively.

The clock dividing circuit 200 provides the PCLK_RO, PCLK_FO, PCLK_RE, and PCLK_FE clock signals, or PCLK_RO_16 and PCLK_FO_16 clock signals, on respective buses to the clock generating circuit 124. As previously described, the clock generating circuit 124 provides complementary strobe clock signals DQS and DQSB responsive to the clock signals from the clock dividing circuit 200. For example, the clock generating circuit 124 may provide the DQS and DQSB clock signals based on one of rising and falling (trailing) clock edges of the PCLK_RO, PCLK_FO, PCLK_RE, and PCLK_FE clock signals when the MODE signal is a first logic level (e.g., first mode) or provide the DQS and DQSB clock signals based on both rising and falling clock edges of the PCLK_RO_16 and PCLK_FO_16 clock signals when the MODE signal is a second logic level (e.g., second mode). In some embodiments of the disclosure, the strobe clock signals DQS and DQSB have twice the clock frequency of the PCLK_RO, PCLK_FO, PCLK_RE, and PCLK_FE clock signals, and of the PCLK_RO_16 and PCLK_FO_16 clock signals (and have the same clock frequency as the ICLK clock signal). As a result, the ICLK clock signal and the DQS and DQSB clock signals are transferred at a first clock frequency and the PCLK_RO, PCLK_FO, PCLK_RE, and PCLK_FE clock signals, and the PCLK_RO_16 and PCLK_FO_16 clock signals are transferred in a second frequency that is one half of the first clock frequency.

Figure 3:
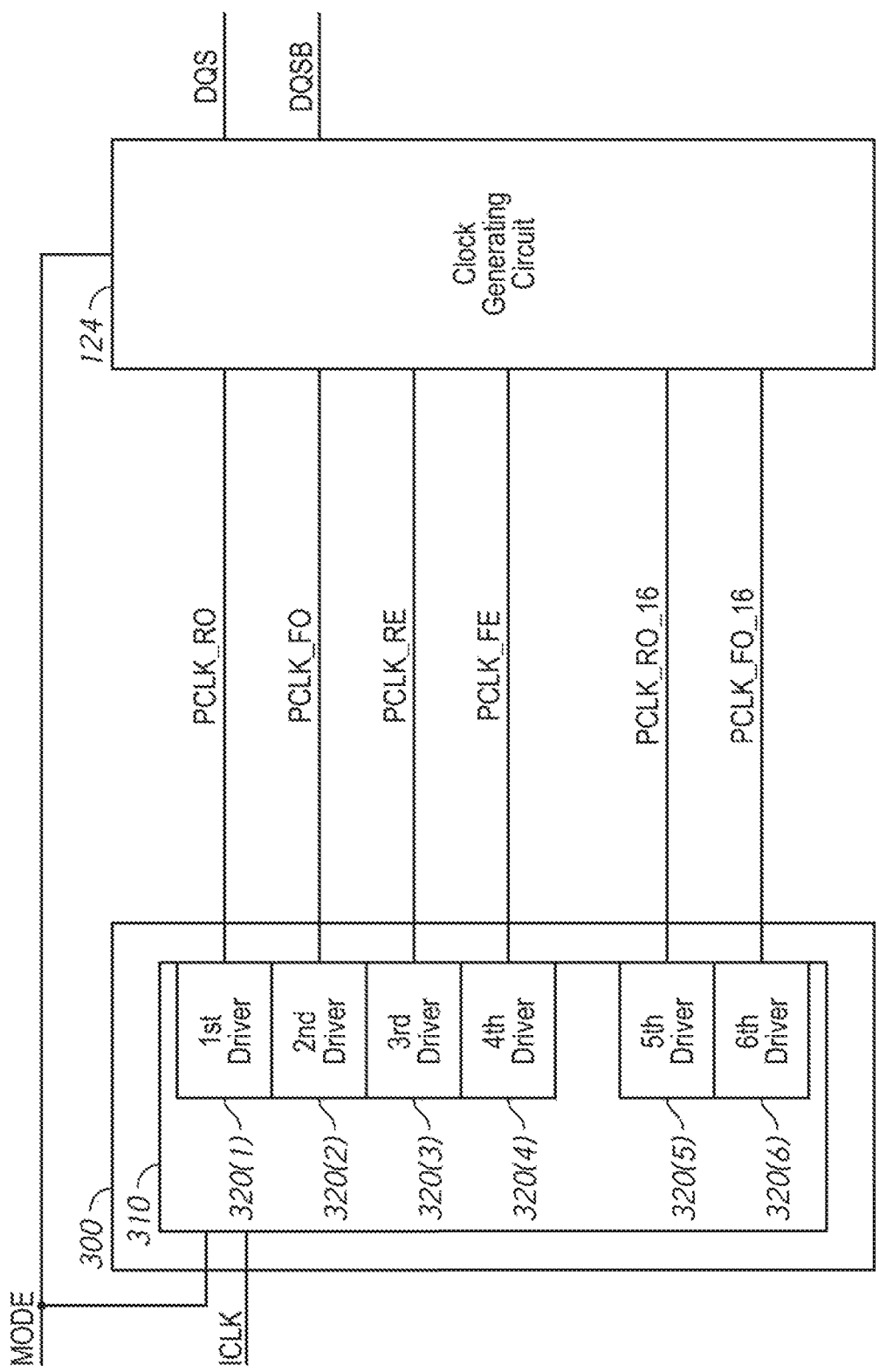
FIG. 3 is a block diagram of a clock dividing circuit according to an embodiment of the disclosure.

FIG. 3 is a block diagram of a clock dividing circuit 300 according to an embodiment of the disclosure. The clock dividing circuit 300 may be including in the clock dividing circuit 122 of the semiconductor 100 (FIG. 1) in some embodiments of the disclosure.

The clock dividing circuit 300 includes a divider circuit 310 that receives an input clock signal ICLK and a control signal MODE. The divider circuit 310 includes driver circuits 320(1), 320(2), 320(3) and 320(4) that provide respective clock signals PCLK_RO, PCLK_FO, PCLK_RE, and PCLK_FE. The PCLK_RO, PCLK_FO, PCLK_RE, and PCLK_FE clock signals may be multiphase clock signals that have a common relative phase to one another. For example, similar to the ICLK0, ICLK90, ICLK180, and ICLK270 clock signals previously described with reference to FIG. 2, the PCLK_RO, PCLK_FO, PCLK_RE, and PCLK_FE clock signals may be multiphase clock signals that have a common relative phase to one another. In an embodiment of the disclosure, the PCLK_RO, PCLK_FO, PCLK_RE, and PCLK_FE clock signals have a relative phase of 90 degrees to one another. For example, the PCLK_FO clock signal is shifted by a phase of 90 degrees relative to the PCLK_RO clock signal, the PCLK_RE clock signal is shifted by a phase of 180 degrees relative to the PCLK_RO clock signal (and is shifted by a phase of 90 degrees relative to the PCLK_FO clock signal), and the PCLK_FE clock signal is shifted by a phase of 270 degrees relative to the PCLK_RO clock signal (and is shifted by a phase of 90 degrees relative to the PCLK_RE clock signal). In such a case, the multiphase clock signals PCLK_RO, PCLK_FO, PCLK_RE, and PCLK_FE clock signals may be referred to as "quadrature" phase clock signals. The PCLK_RO, PCLK_FO, PCLK_RE, and PCLK_FE clock signals provided by the divider circuit 310 may also have a lower clock frequency than the ICLK clock signal. For example, in some embodiments of the disclosure, the PCLK_RO, PCLK_FO, PCLK_RE, and PCLK_FE clock signals have one-half the clock frequency of the ICLK clock signal.

The divider circuit 310 further includes driver circuits 320(5) and 320(6) that provide respective clock signals PCLK_RO_16 and PCLK_FO_16. The PCLK_FO_16 clock signal may have a phase of 90 degrees relative to the PCLK_RO_16 clock signal. The PCLK_RO_16 clock signal may have the same relative phase as the PCLK_RO clock signal and the PCLK_FO_16 clock signal may have the same relative phase as the PCLK_FO clock signal. The PCLK_RO, PCLK_FO, PCLK_RE, and PCLK_FE clock signals and the PCLK_RO_16 and PCLK_FO_16 clock signals provided by the clock dividing circuit 300 have a lower clock frequency than the ICLK clock signal. For example, in some embodiments of the disclosure, the PCLK_RO, PCLK_FO, PCLK_RE, and PCLK_FE clock signals and the PCLK_RO_16 and PCLK_FO_16 clock signals have one-half the clock frequency of the ICLK clock signal.

In operation, the divider circuit 310 provides the PCLK_RO, PCLK_FO, PCLK_RE, and PCLK_FE clock signals responsive to the ICLK clock signal when the MODE signal has a first logic level (e.g., a first mode) and provides the PCLK_RO_16 and PCLK_FO_16 clock signals responsive to the ICLK clock signal when the MODE signal has a second logic level (e.g., second mode). For example, the driver circuits 320(1), 320(2), 320(3), and 320(4) may be activated responsive to the MODE signal having the first logic level to provide the respective PCLK_RO, PCLK_FO, PCLK_RE, and PCLK_FE clock signals. In contrast, the driver circuits 320(5) and 320(6) may be activated responsive to the MODE signal having the second logic level to provide the PCLK_RO_16 and PCLK_FO_16 clock signals.

The clock dividing circuit 300 provides the PCLK_RO, PCLK_FO, PCLK_RE, and PCLK_FE clock signals, or PCLK_RO_16 and PCLK_FO_16 clock signals, on respective buses to the clock generating circuit 124. As previously described, the clock generating circuit 124 provides complementary strobe clock signals DQS and DQSB responsive to the clock signals from the clock dividing circuit 300. The clock generating circuit 124 may provide the DQS and DQSB clock signals based on one of the rising and falling clock edges of the PCLK_RO, PCLK_FO, PCLK_RE, and PCLK_FE clock signals when the MODE signal is a first logic level (e.g., first mode) or provide the DQS and DQSB clock signals based on both rising and falling clock edges of the PCLK_RO_16 and PCLK_FO_16 clock signals when the MODE signal is a second logic level (e.g., second mode). In some embodiments of the disclosure, the strobe clock signals DQS and DQSB have twice the clock frequency of the PCLK_RO, PCLK_FO, PCLK_RE, and PCLK_FE clock signals, and of the PCLK_RO_16 and PCLK_FO_16 clock signals (and have the same clock frequency as the ICLK clock signal). As a result, the ICLK clock signal and the DQS and DQSB clock signals are transferred at a first clock frequency and the PCLK_RO, PCLK_FO, PCLK_RE, and PCLK_FE clock signals, and the PCLK_RO_16 and PCLK_FO_16 clock signals are transferred in a second frequency that is one half of the first clock frequency.

Figure 4:
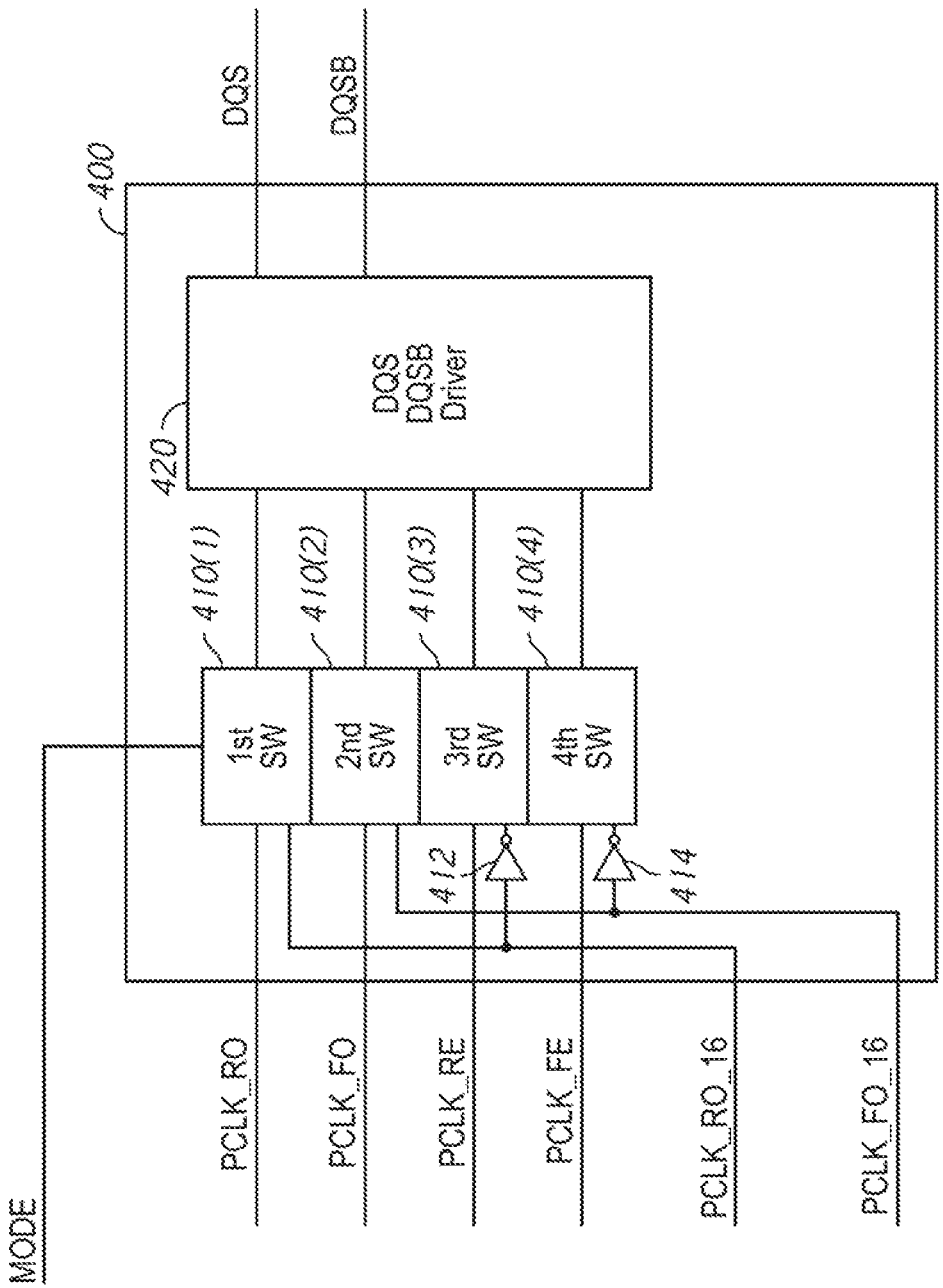
FIG. 4 is a block diagram of a clock generating circuit according to an embodiment of the disclosure.

FIG. 4 is a block diagram of a clock generating circuit 400 according to an embodiment of the disclosure. The clock generating circuit 400 may be included in the clock generating circuit 124 of FIG. 1, 2, or 3 in some embodiments of the disclosure. The PCLK_RO, PCLK_FO, PCLK_RE, and PCLK_FE clock signals, and PCLK_RO_16 and PCLK_FO_16 clock signals may be provided by a clock dividing circuit, for example, by the clock dividing circuit 122 of FIG. 1, the clock dividing circuit 200 of FIG. 2, or the clock dividing circuit 300 of FIG. 3.

The clock generating circuit 400 includes switch circuits 410(1), 410(2), 410(3), and 410(4). Each switch circuits 410 receives a control signal MODE, and further receives a respective first clock signal and a respective second clock signal. For example, in the embodiments of FIG. 4, the switch circuit 410(1) receives a PCLK_RO clock signal and a PCLK_RO_16 clock signal; the switch circuit 410(2) receives a PCLK_FO clock signal and a PCLK_FO_16 clock signal; the switch circuit 410(3) receives a PCLK_RE clock signal and the complement of the PCLK_RO_16 clock signal; and the switch circuit 410(4) receives a PCLK_FE clock signal and the complement of the PCLK_FO_16 clock signal. The complement of the PCLK_RO_16 clock signal and the complement of the PCLK_FO_16 clock signal are provided by inverter circuits 412 and 414, respectively. Although the inverter circuits 412 and 414 are shown in FIG. 4 as included in the clock generating circuit 400, the inverter circuits 412 and 414 may be included elsewhere without departing from the scope of the disclosure. For example, in some embodiments of the disclosure, the inverter circuits may be included in a clock dividing circuit that provides clock signals to the clock generating circuit. In some embodiments of the disclosure, the inverter circuits may be included on clock buses on which the internal clock signals from the clock dividing circuit are provided to the clock generating circuit. The scope of the disclosure in not limited to the particular location of the inverter circuits.

Each of the switch circuits 410(1), 410(2), 410(3), and 410(4) provides the respective first clock signal or the respective second clock signal based on the MODE signal. For example, each of the switch circuits 410(1), 410(2), 410(3), and 410(4) provides the respective first clock signal when the MODE signal has a first logic level (e.g., a first mode) and provides the respective second clock signal when the MODE signal has a second logic level (e.g., a second mode). The clock generating circuit 400 further includes a strobe driver 420. The strobe driver 420 receives a respective clock signal from each of the switch circuits 410(1), 410(2), 410(3), and 410(4), and provides complementary strobe clock signals DQS and DQSB. The DQS and DQSB clock signals have a clock frequency that is higher than the clock frequency of the clock signals PCLK_RO, PCLK_FO, PCLK_RE, and PCLK_FE, and PCLK_RO_16 and PCLK_FO_16.

In operation, the clock generating circuit 400 provides DQS and DQSB clock signals based on the PCLK_RO, PCLK_FO, PCLK_RE, and PCLK_FE clock signals when the MODE signal has a logic level corresponding to the first mode, and provides DQS and DQSB clock signals based on the PCLK_RO_16 and PCLK_FO_16 clock signals (which are used to provide the complement of the PCLK_RO_16 clock signal and the complement of the PCLK_FO_16 clock signal) when the MODE signal has a logic level corresponding to the second mode. For example, the clock generating circuit 124 may provide the DQS and DQSB clock signals based on one of rising and falling (trailing) clock edges of the PCLK_RO, PCLK_FO, PCLK_RE, and PCLK_FE clock signals when the MODE signal is a first logic level (e.g., first mode) or provide the DQS and DQSB clock signals based on both rising and falling clock edges of the PCLK_RO_16 and PCLK_FO_16 clock signals when the MODE signal is a second logic level (e.g., second mode). In some embodiments of the disclosure, the mode of operation may be selected based on a clock frequency of the CLKT and CLKB clock signals (as represented by the ICLK clock signal). For example, the first mode may be used when the CLKT and CLKB clock signals have a relatively higher frequency and greater clock accuracy is desired for the DQS and DQSB clock signals (e.g., less duty cycle error, less phase deviation, etc.). The DQS and DQSB clock signals may have greater clock accuracy in the first mode because the four clock signals PCLK_RO, PCLK_FO, PCLK_RE, and PCLK_FE are used to provide the DQS and DQSB clock signals. In contrast, the second mode may be used when the CLKT and CLKB clock signals have a relatively lower clock frequency and less clock accuracy for the DQS and DQSB clock signals is acceptable. The DQS and DQSB clock signals may have less clock accuracy in the second mode (when compared to the first mode) because the two clock signals PCLK_RO_16 and PCLK_FO_16 clock signals, and their complementary clock signals, are used to provide the DQS and DQSB clock signals.

Higher frequency CLKT and CLKB clock signals may be used for faster data rates, for example, when a data rate of 3.2 gbps (gigabits per second) or greater may be desirable. Lower frequency CLKT and CLKB clock signals may be used for slower data rates, for example, when a data rate of half the faster data rate is desired (e.g., 1.6 gbps).

Figure 5A:
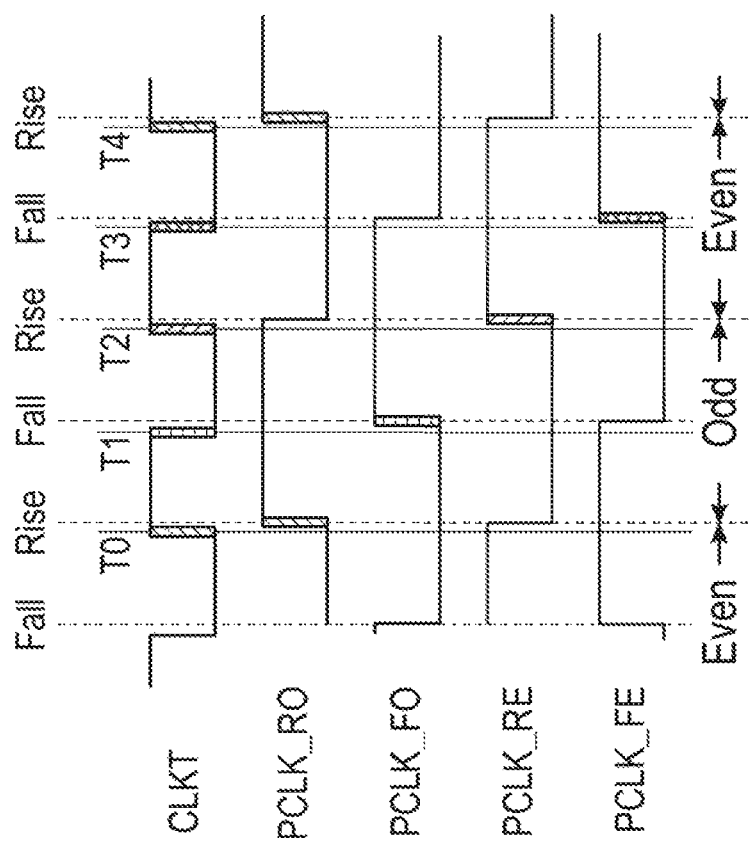
FIGS. 5A and 5B are timing diagrams of various clock signals provided by a clock dividing circuit having first and second modes of operation according to an embodiment of the disclosure.
Figure 5B:
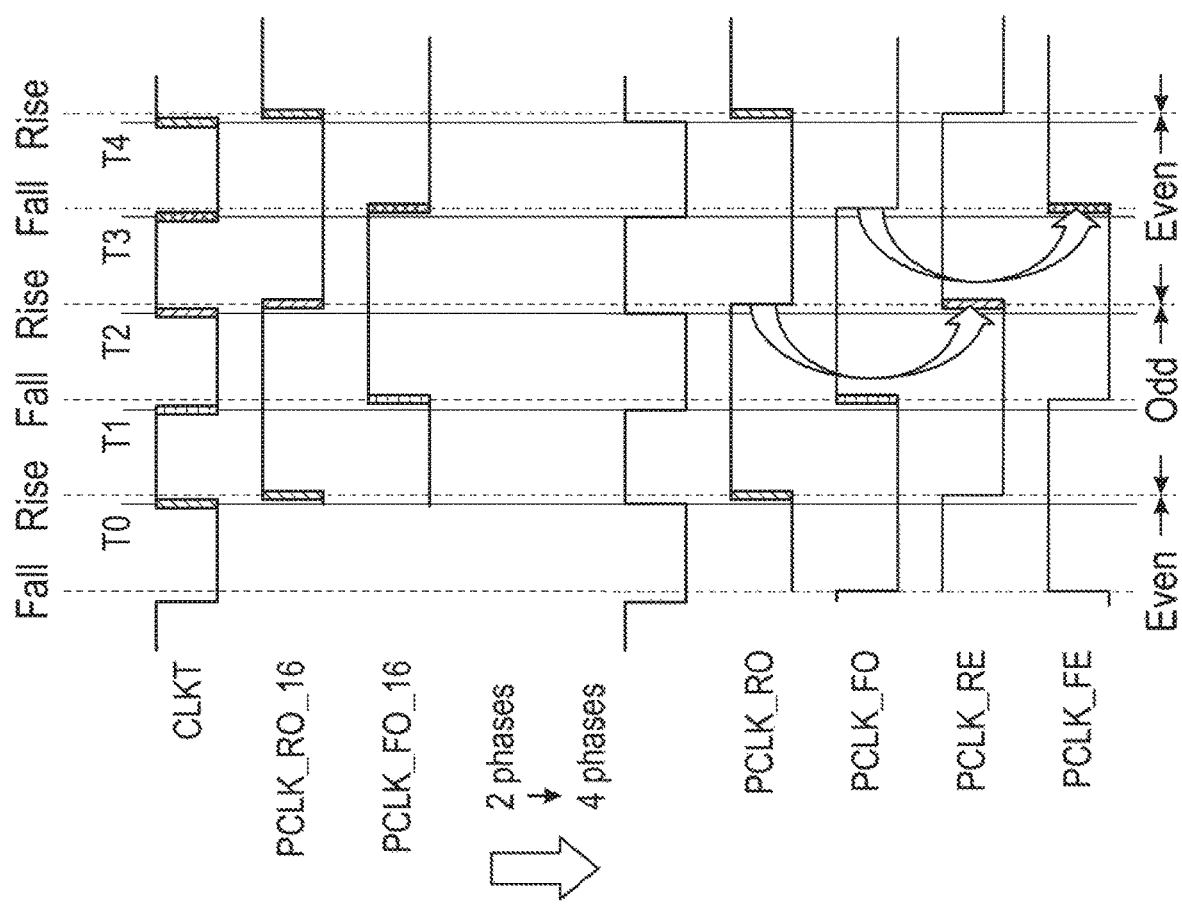

FIGS. 5A and 5B are timing diagrams of clock signals PCLK_RO, PCLK_FO, PCLK_RE, and PCLK_FE, and clock signals PCLK_RO_16 and PCLK_FO_16 provided by a clock dividing circuit having first and second modes of operation according to an embodiment of the disclosure. For example, the PCLK_RO, PCLK_FO, PCLK_RE, and PCLK_FE clock signals of FIG. 5A are provided by the clock dividing circuit in a first mode, and the PCLK_RO_16 and PCLK_FO_16 clock signals of FIG. 5B may be provided by the clock dividing circuit in a second mode. In some embodiments of the disclosure, the clock dividing circuit is the clock dividing circuit 200 of FIG. 2. In some embodiments of the disclosure, the clock dividing circuit is the clock dividing circuit 300 of FIG. 3.

With reference to FIG. 5A, an external clock signal CLKT is shown having rising clock edges at times T0, T2, and T4, and having falling (trailing) clock edges at times T1 and T3. The PCLK_RO, PCLK_FO, PCLK_RE, and PCLK_FE clock signals provided by the clock dividing circuit in the first mode are shown in FIG. 5A as having have one-half the clock frequency of the CLKT clock signal, and having a 90 degree phase relationship with one another.

The clock dividing circuit provides PCLK_RO, PCLK_FO, PCLK_RE, and PCLK_FE clock signals having rising clock edges that are based on a corresponding rising or falling clock edge of the CLKT clock signal. For example, a rising clock edge of the PCLK_RO clock signal is based on the rising clock edge of the CLKT clock signal at time T0; a rising clock edge of the PCLK_FO clock signal is based on the falling clock edge of the CLKT clock signal at time T1; a rising clock edge of the PCLK_RE clock signal is based on the rising clock edge of the CLKT clock signal at time T2; and a rising clock edge of the PCLK_FE clock signal is based on the falling clock edge of the CLKT clock signal at time T3. The sequence of rising clock edges for the PCLK_RO, PCLK_FO, PCLK_RE, and PCLK_FE clock signals repeats again with a second rising clock edge of the PCLK_RO clock signal based on the rising clock edge of the CLKT clock signal at time T4.

By using corresponding rising or falling clock edges of the CLKT clock signal to provide four multiphase clock signals PCLK_RO, PCLK_FO, PCLK_RE, and PCLK_FE, duty cycle error of the CLKT signal may not significantly impact the timing of the rising clock edges for the resulting PCLK_RO, PCLK_FO, PCLK_RE, and PCLK_FE clock signals, and consequently, have a relatively higher degree of timing accuracy. However, when providing the PCLK_RO, PCLK_FO, PCLK_RE, and PCLK_FE clock signals using corresponding rising or falling clock edges of the CLKT clock signal, the clock dividing circuit may consume relatively more power.

With reference to FIG. 5B, an external clock signal CLKT is shown having rising clock edges at times T0, T2, and T4, and having falling clock edges at times T1 and T3. The PCLK_RO_16 and PCLK_FO_16 clock signals provided by the clock dividing circuit in the second mode are shown in FIG. 5B as having have one-half the clock frequency of the CLKT clock signal, and have a 90 degree phase relationship with one another. In contrast to FIG. 5A, only two clock signals, (e.g., PCLK_RO_16 and PCLK_FO_16 clock signals) are provided by the clock dividing circuit instead of four clock signals (e.g., PCLK_RO, PCLK_FO, PCLK_RE, and PCLK_FE clock signals). As a result, power consumption by the clock dividing circuit is relatively lower in the second mode compared to the first mode.

Rising and falling clock edges of the PCLK_RO_16 clock signal may be based on a corresponding rising clock edges of the CLKT clock signal, and rising and falling clock edges of the PCLK_FO_16 clock signal may be based on corresponding falling clock edges of the CLKT clock signal. For example, as shown in FIG. 5B the rising clock edges of the CLKT clock signal at times T0, T2, and T4 correspond to rising, falling, and rising clock edges, respectively, of the PCLK_RO_16 clock signal; and the falling clock edges of the CLKT clock signal at times T1 and T3 correspond to rising and falling clock edges, respectively, of the PCLK_FO_16 clock signal.

The PCLK_RO_16 clock signal has the same relative timing as the PCLK_RO clock signal and the PCLK_RO_16 clock signal has the same relative timing as the PCLK_FO clock signal. Additionally, the complement of the PCLK_RO_16 clock signal has the same relative timing as the PCLK_RE clock signal and the complement of the PCLK_FO_16 clock signal has the same relative timing as the PCLK_FE clock signal. As such, the PCLK_RO_16 clock signal, the PCLK_FO_16 clock signal, the complement of the PCLK_RO_16 clock signal, and the complement of the PCLK_FO_16 clock signal may be used to generate strobe clock signals. For example, as previously described with reference to FIG. 4, switch circuits 410 may be provided with PCLK_RO, PCLK_FO, PCLK_RE, and PCLK_FE clock signals, and further provided with PCLK_RO_16, PCLK_FO_16, complement of PCLK_RO_16, and complement of PCLKFO_16 clock signals. The PCLK_RO, PCLK_FO, PCLK_RE, and PCLK_FE clock signals may be provided to the strobe driver 420 in a first mode or the PCLK_RO_16, PCLK_FO_16, complement of PCLK_RO_16, and complement of PCLKFO_16 clock signals may be provided to the strobe driver 420 in a second mode.

Falling edges of the PCLK_RO_16 and PCLK_FO_16 clock signals may have timing error due to CLKT duty cycle error, which may negatively affect the timing accuracy of the complement of the PCLK_RO_16 clock signal and the complement of the PCLKFO_16 clock signal because falling clock edges of the PCLK_RO_16 and PLCK_FO_16 clock signals correspond to rising clock edges of their respective complementary clock signals. As a result, using the PCLK_RO_16 and PCLK_FO_16 clock signals and the complement of the PCLK_RO_16 clock signal and the complement of the PCLK_FO_16 clock signal may provide strobe clock signals having less timing accuracy compared to using PCLK_RO, PCLK_FO, PCLK_RE, and PCLK_FE clock signals generated from clock edges of the CLKT clock signal. However, a benefit of using the PCLK_RO_16 and PCLK_FO_16 clock signals and the complement of the PCLK_RO_16 clock signal and the complement of the PCLK_FO_16 clock signal to provide strobe clock signals is that less power may be consumed by the clock dividing circuit in providing the two PCLK_RO_16 and PCLK_FO_16 clock signals compared to providing the four PCLK_RO, PCLK_FO, PCLK_RE, and PCLK_FE clock signals.

In summary, a clock dividing circuit according to an embodiment of the disclosure may provide the PCLK_RO, PCLK_FO, PCLK_RE, and PCLK_FE clock signals having a relatively higher degree of timing accuracy in a first mode, but with relatively higher power consumption; and provide the PCLK_RO_16 and PCLK_FO_16 clock signals in a second mode, which may be used to provide the PCLK_RO, PCLK_FO, PCLK_RE, and PCLK_FE clock signals having a relatively lower degree of timing accuracy, but with relatively lower power consumption. The first mode may be desirable when the CLKT clock signal has a relatively high clock frequency, and greater timing accuracy for the PCLK_RO, PCLK_FO, PCLK_RE, and PCLK_FE clock signals is desirable. In contrast, the second mode may be desirable when the CLKT clock signal has a relatively low clock frequency and the timing accuracy for one or more of the PCLK_RO, PCLK_FO, PCLK_RE, and PCLK_FE clock signals that rely on falling edges of a divided clock signal (e.g., the complement of the PCLK_RO_16 clock signal and the complement of the PCLK_FO_16 clock signal) is acceptable.

Figure 6:
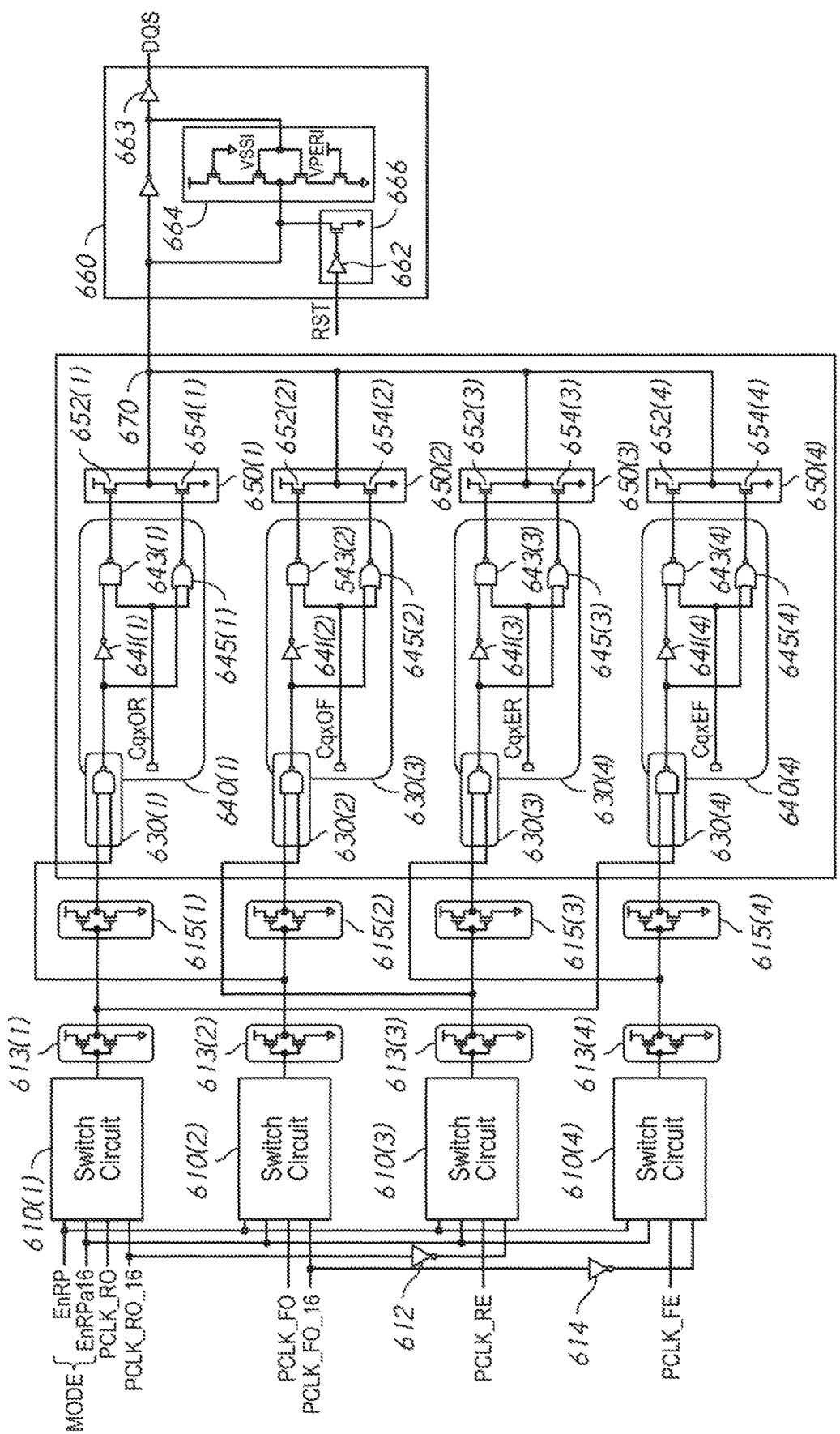
FIG. 6 is a schematic diagram of a clock generating circuit according to an embodiment of the disclosure.

FIG. 6 is a schematic diagram of a clock generating circuit 600 according to an embodiment of the disclosure. The clock generating circuit 600 may be included in the clock generating circuit 124 of FIG. 1, 2, or 3 in some embodiments of the disclosure. The clock generating circuit may be included in the clock generating circuit 400 of FIG. 4 is some embodiments of the disclosure.

The clock generating circuit 600 includes switch circuits 610(1), 610(2), 610(3), and 610(4) that receive respective clock signals and a control signal MODE. For example, the switch circuit 610(1) receives PCLK_RO and PCLK_RO_16 clock signals; the switch circuit 610(2) receives PCLK_FO and PCLK_FO_16 clock signals; the switch circuit 610(3) receives PCLK_RE clock signal and the complement of the PCLK_RO_16 clock signal; and the switch circuit 610(4) receives a PCLK_FE clock signal and the complement of the PCLK_FO_16 clock signal. The complement of the PCLK_RO_16 clock signal and the complement of the PCLK_FO_16 clock signal are provided by inverter circuits 612 and 614, respectively. The MODE signal includes control signals EnRP and EnRPa16. An active EnRP signal (e.g., active high logic level) controls the switch circuits 610(1), 610(2), 610(3), and 610(4) to provide the PCLK_RO, PCLK_FO, PCLK_RE, and PCLK_FE clock signals, respectively, while an active EnRPa16 signal (e.g., active high logic level) controls the switch circuits 610(1), 610(2), 610(3), and 610(4) to provide the PCLK_RO_16 and PCLK_FO_16 clock signals, the complement of PCLK_RO_16 clock signal, and the complement of PCLK_FO_16 clock signal, respectively.

Each of the switch circuits 610(1), 610(2), 610(3), and 610(4) provides the respective clock signal to a strobe driver 620 through respective buffer circuits 613 and 615. The buffer circuits 613 and 615 may be omitted in some embodiments of the disclosure. The buffer circuits 613 and 615 may buffer the clock signals provided by the switch circuits 610(1), 610(2), 610(3), and 610(4), when driven over signal lines to the strobe driver 620. The buffer circuits 613 and 615 are shown in FIG. 6 as inverter circuits. However, other circuits may be used for the buffer circuits 613 and 615 without departing from the scope of the disclosure.

The strobe driver 620 includes input circuits 630(1), 630(2), 630(3), and 630(4) each receiving respective clock signals from the buffer 613 and 615. Each input circuit 630 receives a first clock signal and a second clock signal that is out of phase from the first clock signal. For example, the input circuit 630(1) receives the PCLK_RO clock signal (or PCLK_RO_16 clock signal) from the buffer circuit 615(1) and receives the complement of the PCLK_FO clock signal (or the complement of the PCLK_FO_16 clock signal) from the buffer circuit 613(2); the input circuit 630(2) receives the PCLK_FO clock signal (or PCLK_FO_16 clock signal) from the buffer circuit 615(2) and receives the complement of the PCLK_RE clock signal (or the PCLK_RO_16 clock signal) from the buffer circuit 613(3); the input circuit 630(3) receives the PCLK_RE clock signal (or PCLK_RO_16 clock signal) from the buffer circuit 615(2) and receives the complement of the PCLK_FE clock signal (or the PCLK_FO_16 clock signal) from the buffer circuit 613(4); and the input circuit 630(4) receives the PCLK_FE clock signal (or the complement of the PCLK_FO_16 clock signal) from the buffer circuit 615(4) and receives the complement of the PCLK_RO clock signal (or the PCLK_RO_16 clock signal) from the buffer circuit 613(1).

Each of the input circuits 630(1), 630(2), 630(3), and 630(4) include a NAND logic gate that provides an output to a respective pre-driver circuit 640. When enabled, each of the pre-driver circuits 640 provides driver signals PU and PD to control a respective driver circuit 650. The pre-driver circuit 640 provides the PU and PD signals based on the clock signals provided to the respective input circuit 630. The driver circuits 650 each provide a high logic level or a low logic level output signal to an output node 670 of the strobe driver 620 based on the PU and PD signals from the respective pre-driver circuit 640.

Each of the pre-driver circuits 640 includes an inverter circuit 641, NAND logic gate 643, and a NOR logic gate 645. The output from the respective input circuit 630 is provided to an input of the NOR logic gate 645, and a complement of the output from the respective input circuit 630 is provided to the NAND logic gate 643 via the inverter circuit 641. The NAND logic gate 643 and the NOR logic gate 645 are further provided an enable signal. Each pre-driver circuit 640 is provided a respective enable signal. For example, the pre-driver circuit 640(1) is provided an enable signal CqxOR; the pre-driver circuit 640(2) is provided an enable signal CqxOF; the pre-driver circuit 640(3) is provided an enable signal CqxER; and the pre-driver circuit 640(4) is provided an enable signal CqxEF. The enable signals may be provided, for example, from a command decoder (e.g., command decoder 115 of FIG. 1).

Each driver circuit 650 includes a pull-up transistor 652 and a pull-down transistor 654. The pull-up transistor 652 provides a supply voltage from a power supply when activated by the PU signal and the pull-down transistor 654 provides a reference voltage (e.g., ground) when activated by the PD signal. The respective output signals from the driver circuits 650 are provided to the output node 670, where the output signals are combined to provide a strobe clock signal. The resulting strobe clock signal has a clock frequency that is twice the clock frequency of the PCLK_RO, PCLK_FO, PCLK_RE, and PCLK_FE clock signals, and the PCL_RO_16 and PCLK_FO_16 clock signals.

An optional latch circuit 660 may be coupled to the output node 670 to latch the strobe clock signal levels. The latch circuit 660 of FIG. 6 includes inverter circuits 662 and 664 configured as a latch, and further includes inverter circuit 663 to provide the strobe clock signal. When activated by reset signal RST, a reset circuit 666 resets the latch of inverter circuits 662 and 664 to provide a high clock level.

Figure 7:
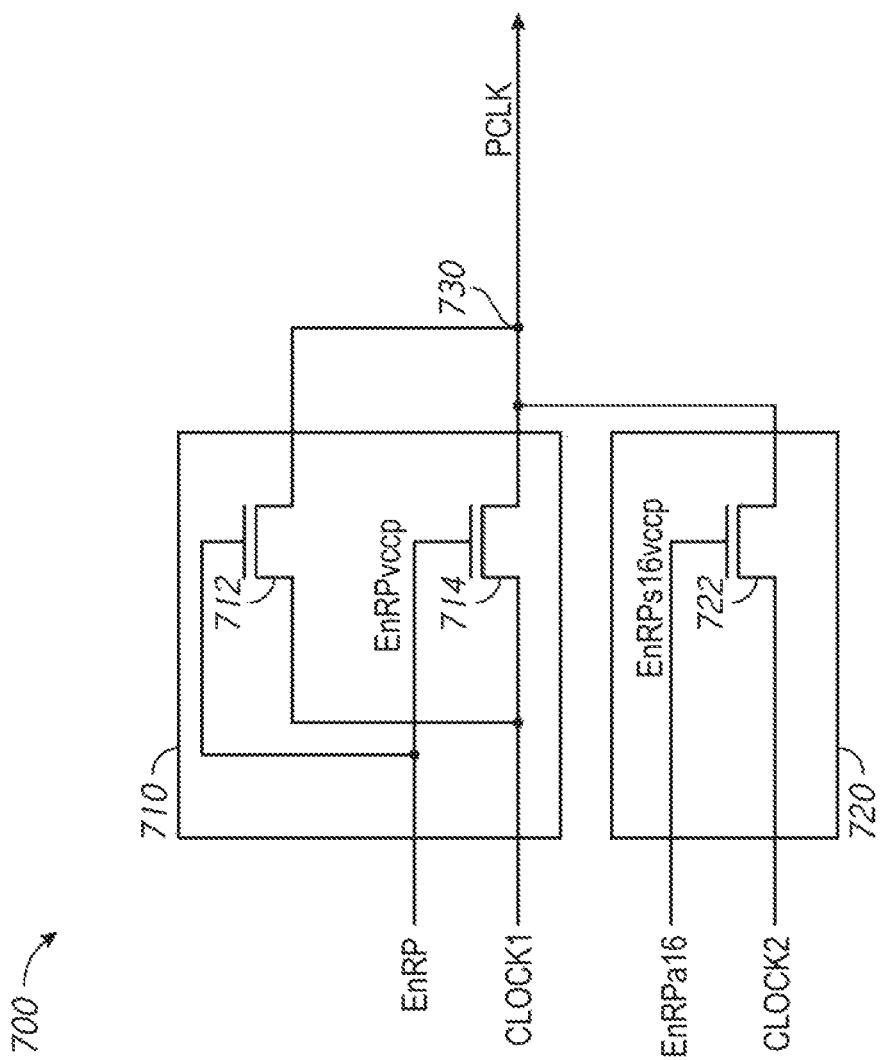
FIG. 7 is a schematic diagram of a switch circuit according to an embodiment of the disclosure.

FIG. 7 is a schematic diagram of a switch circuit 700 according to an embodiment of the disclosure. The switch circuit 700 may be included in each of the switch circuits 610 of FIG. 6, in some embodiments of the disclosure.

The switch circuit 700 includes switch blocks 710 and 720. The switch block 710 is provided a first clock signal CLOCK1 and a control signal EnRP. The switch block 710 includes a transistor 712 and transistor 714. When an active EnRP signal (e.g., active high logic level) is provided to the switch block 710, the transistors 712 and 714 are activated to provide the CLOCK1 clock signal as an output clock signal PCLK to an output node 730. The switch block 720 is provided a second clock signal CLOCK2 and a control signal EnRPa16. The switch block 720 includes a transistor 722. When an active EnRPa16 signal (e.g., active high logic level) is provided to the switch block 720, the transistor 722 is activated to provide the CLOCK2 clock signal as the PCLK clock signal to the output node 730.

In embodiments of the disclosure including the switch circuit 700 in each of the switch circuits 610(1), 610(2), 610(3), and 610(4), the PCLK_RO, PCLK_FO, PCLK_RE, PCLKFE clock signals may be provided to the respective switch circuit as the CLOCK1 clock signal and the PCLK_RO_16, PCLK_FO_16, complement of the PLCK_RO_16, and complement of the PCLK_FO_16 may be provided to the respective switch circuit as the CLOCK2 clock signal.

Figure 8:
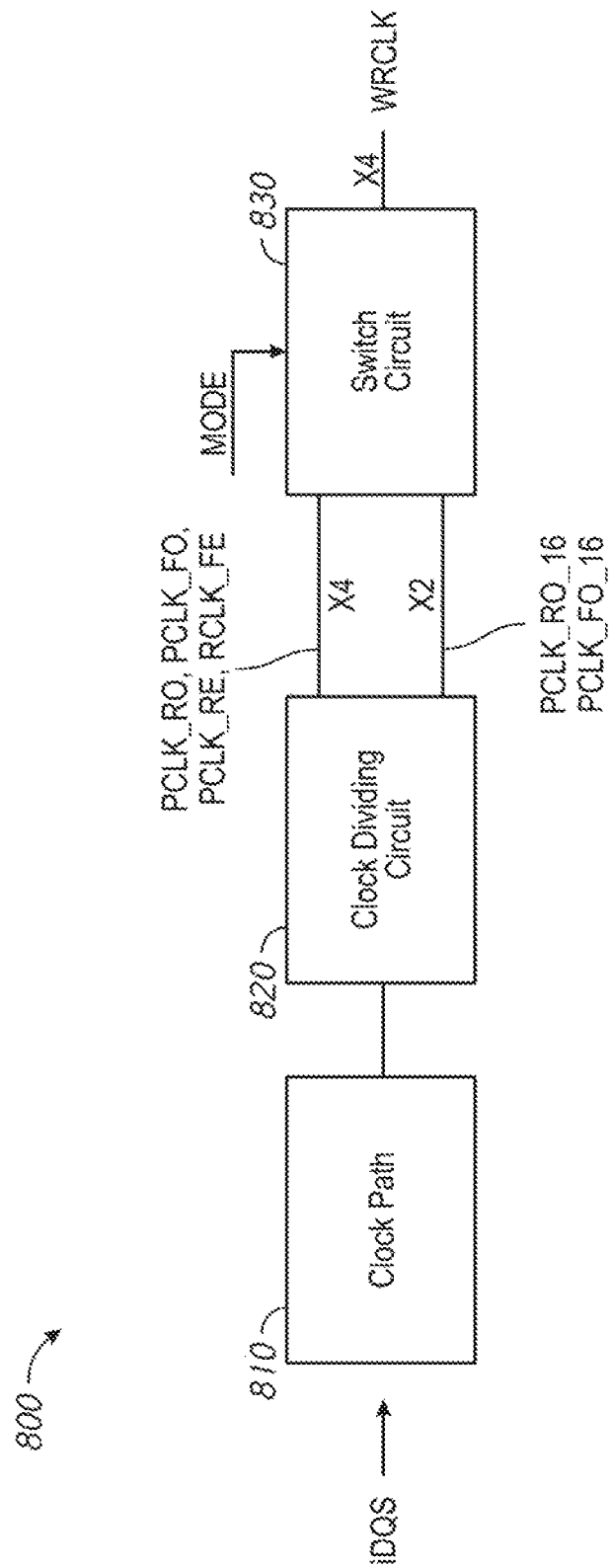
FIG. 8 is a block diagram of an input data clock path according to an embodiment of the disclosure.

The generation of internal multiphase clock signal from an external clock signal as described may also be applied to providing internal clock signals from a data strobe signal. The internal clock signals may be used to clock input data circuits, for example, included in the I/O circuit 160. FIG. 8 is a block diagram of an input data clock path 800 according to an embodiment of the disclosure. The input data clock path 800 may be included in the input data clock path 164 of semiconductor device 100 in some embodiments of the disclosure.

The input data clock path 800 includes a clock path 810 that provides clock signal(s) received from an input buffer, for example, input buffer 162 of the semiconductor device 100, to a clock dividing circuit 820. The clock path 810 may include signal lines and circuits to provide the clock signal(s) from the input buffer to the clock dividing circuit 820, for example, conductive signal lines, buffer circuits, etc. In some embodiments of the disclosure, the clock dividing circuit 800 includes clock dividing circuit 200 of FIG. 2. In some embodiments of the disclosure, the clock dividing circuit 800 includes clock dividing circuit 300 of FIG. 3. In such embodiments, the ICLK clock signal is based on the data strobe clock signals DQS and DQSB.

The clock dividing circuit 820 provides four multiphase clock signals (PCLK_RO, PCLK_FO, PCLK_RE, PCLK_FE) having a phase relationship relative to one another, and further provides two multiphase clock signals (PCLK_RO_16, PCLK_FO_16) having a phase relationship relative to one another. For example, in some embodiments of the disclosure the four multiphase clock signals have a 90 degree phase relationship with one another, such as 0 degrees, 90 degrees, 180 degrees, and 270 degrees, and the two multiphase clock signals are 90 degrees out of phase, such as 0 degrees and 90 degrees. The four multiphase clock signals and the two multiphase clock signals may have clock frequencies that are lower than the input clock signal, for example, one half the clock frequency. The two multiphase clock signals may have the same relative timing as two of the four multiphase clock signals, for example, the 0 degree and 90 degree clock signals.

The four multiphase clock signals and the two multiphase clock signals are provided to a switch circuit 830 that provides four multiphase input data clock signals WRCLK. The WRCLK may have a phase relationship of 90 degrees with one another (e.g., WRCLK0, WRCLK90, WRCLK180, WRCLK270). The WRCLK clock signals may be provided to clock circuits that receive data, for example, to circuits including in the I/O circuit 160 to receive write data. The four multiphase WRCLK clock signals may be based on the four multiphase clock signals or the two multiphase clock signals from the clock dividing circuit 820. Selection by the switch circuit 830 of whether the four multiphase clock signals or the two multiphase clock signals is controlled by a control signal MODE. For example, when the MODE signal has a first logic level (e.g., a first mode), the switch circuit 830 may provide the four multiphase WRCLK clock signals based on the four multiphase clock signals from the clock dividing circuit 820, and when the MODE signal has a second logic level (e.g., second mode), the switch circuit 830 may provide the four multiphase WRCLK clock signals based on the two multiphase clock signals.

Figure 9:
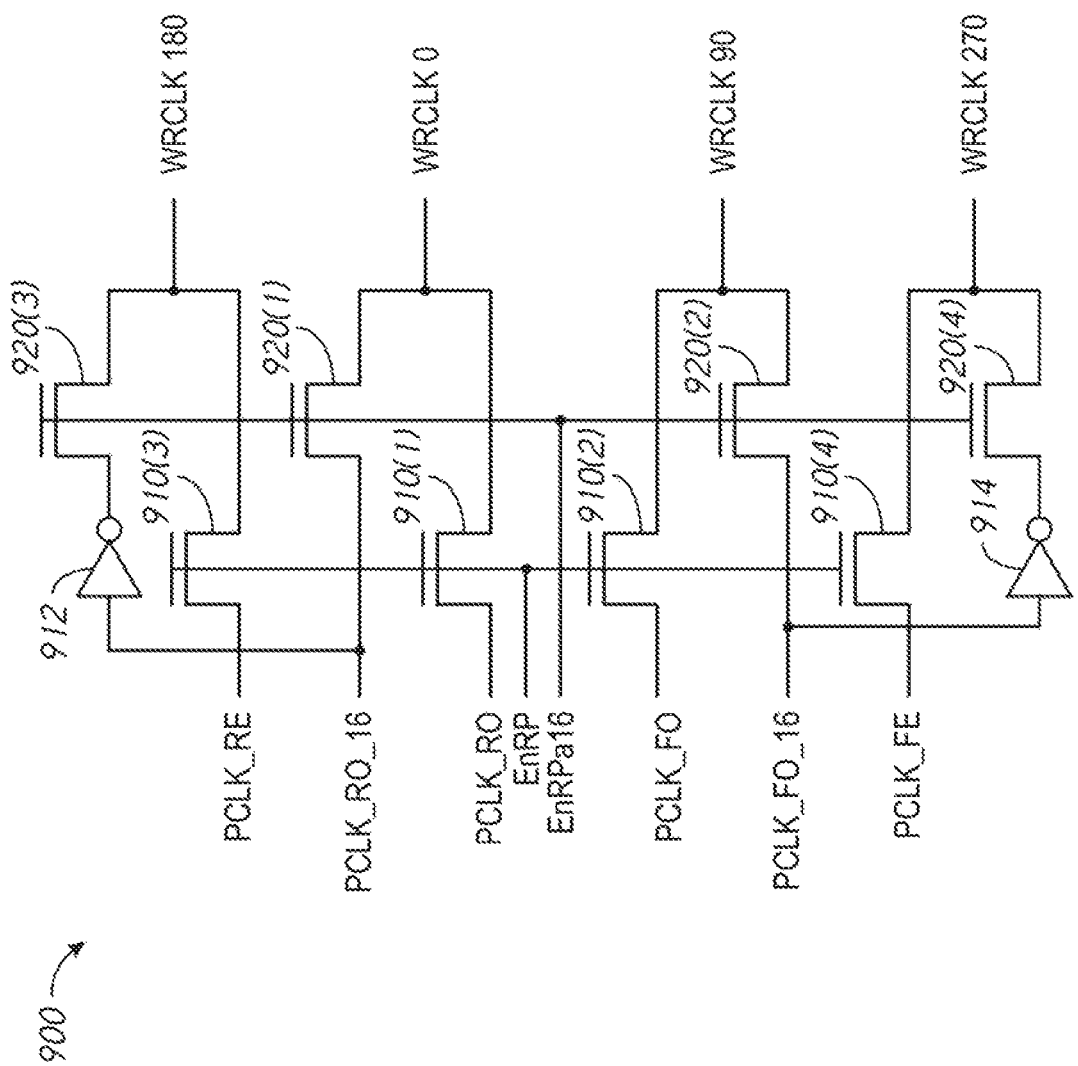
FIG. 9 is a schematic diagram of a switch circuit according to an embodiment.

FIG. 9 is a schematic diagram of a switch circuit 900 according to an embodiment of the disclosure. In some embodiments of the disclosure, the switch circuit 900 may be included in the switch circuit 830.

The switch circuit 900 includes transistors 910(1)-910(4) and transistors 920(1)-920(4). The transistors 910(1)-910(4) are provided PCLK_RO, PCLK_FO, PCLK_RE, PCLK_FE clock signals, respectively. The transistors 920(1)-920(4) are provided PCLK_RO_16, PCLK_FO_16, complement of the PCLK_RO_16, and complement of the PCLK_FO_16 clock signals, respectively. When activated by an active control signal EnRP (e.g., first mode), the transistors 910(1)-910(4) provide the PCLK_RO, PCLK_FO, PCLK_RE, PCLK_FE clock signals as the WRCLK0, WRCLK90, WRCLK180, WRCLK270 clock signals, respectively. When activated by an active control signal EnRPa16 (e.g., second mode), the transistors 920(1)-920(4) provide the PCLK_RO_16, PCLK_FO_16, complement of the PCLK_RO_16, and complement of the PCLK_FO_16 clock signals as the WRCLK0, WRCLK90, WRCLK180, WRCLK270 clock signals, respectively.

Enabling the first mode may be used to provide the WRCLK0, WRCLK90, WRCLK180, WRCLK270 clock signals having a higher degree of timing accuracy due to the use of the four PCLK_RO, PCLK_FO, PCLK_RE, PCLK_FE clock signals. A clock dividing circuit may consume greater power, however, in providing the four PCLK_RO, PCLK_FO, PCLK_RE, PCLK_FE clock signals. Enabling the second mode may be used to provide the WRCLK0, WRCLK90, WRCLK180, WRCLK270 clock signals having a lower degree of timing accuracy due to the use of the PCLK_RO_16, PCLK_FO_16, complement of the PCLK_RO_16, and complement of the PCLK_FO_16 clock signals. A clock dividing circuit may consume less power, however, in providing the two PCLK_RO_16, PCLK_FO_16 clock signals.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An apparatus, comprising:
a clock generating circuit configured to:
in a first mode selected based on a first clock frequency, generate the output clock signal with timing of rising edges determined responsive to rising edges of a first clock signal and a second clock signal and timing of falling edges determined responsive to rising edges of a third clock signal and a fourth clock signal, wherein phases of each of the first, second, third and fourth clock signals are shifted relative to each other; and
in a second mode selected based on a second clock frequency that is lower than the first clock frequency, generate the output clock signal with timing of rising edges determined responsive to both rising edges and falling edges of a fifth clock signal and timing of falling edges determined responsive to both rising edges and falling edges a sixth clock signal.

2. The apparatus of claim 1, further comprising:
a first set of buses configured to provide the first, second, third and fourth clock signals; and
a second set of buses configured to provide the fifth and sixth clock signals.

3. The apparatus of claim 2, wherein the second set of buses are electrically decoupled from the first set of buses.

4. The apparatus of claim 1, wherein each of the first, second, third and fourth clock signals have a first frequency and each of the fifth and sixth clock signals have a second frequency.

5. The apparatus of claim 4, wherein the first frequency is greater than the second frequency.

6. The apparatus of claim 4, wherein the second frequency is half of the first frequency.

7. The apparatus of claim 1, wherein the first clock signal is shifted in phase by a first amount relative to the second clock signal, the second clock signal is shifted in phase by the first amount relative to the third clock signal, the third clock signal is shifted in phase by the first amount relative to the fourth clock signal, the fourth clock signal is shifted in phase by the first amount relative to the first clock signal.

8. The apparatus of claim 7, wherein the fifth clock signal is shifted in phase by the first amount to the sixth clock signal.

9. The apparatus of claim 7, wherein the first amount is equal to 90 degrees.

10. The apparatus of claim 1, further comprising a clock driver configured to provide the first, second, third and fourth clock signals based on an input clock signal while in the first mode and to provide the fifth and sixth clock signals based on the input clock signal while in the second mode.

11. A method, comprising:
while in a first mode selected based on a first clock frequency, providing an output clock signal by:
generating a rising edges of the output clock signal in response to rising edges of a first clock signal and a second clock signal; and
generating falling edges of the output clock signal in response to rising edges of a third clock signal and a fourth clock signal, wherein phases of each of the first, second, third and fourth clock signals are shifted relative to each other; and
while in a second mode selected based on a second clock frequency that is lower than the first clock frequency, providing an output clock signal by:
generating the rising edges of the output clock signal in response to both rising edges and falling edges of a fifth clock signal; and
generating the falling edges of the output clock signal in response to both rising edges and falling edges of a sixth clock signal.

12. The method of claim 11, further comprising:
providing the first, second, third and fourth clock signals based on an input clock signal while in the first mode; and
providing the fifth and sixth clock signals based on the input clock signal while in the second mode.

13. The method of claim 12, further comprising:
providing the first clock signal shifted in phase by a first amount relative to the second clock signal;
providing the second clock signal shifted in phase by the first amount relative to the third clock signal;
providing the third clock signal shifted in phase by the first amount relative to the fourth clock signal; and
providing the fourth clock signal shifted in phase by the first amount relative to the first clock signal.

14. The method of claim 13, further comprising providing the fifth clock signal shifted in phase by a second amount relative to the sixth clock signal.

15. The method of claim 14, wherein the first amount is equal to the second amount.

16. The method of claim 14, wherein the first amount is equal to 90 degrees.

17. The method of claim 12, further comprising receiving an input data strobe signal as the input clock signal.

18. The method of claim 11, further comprising:
generating the first, second, third, and fourth clock signals each having a first frequency; and
generating the fifth and sixth clock signals each having a second frequency.

19. The method of claim 18, wherein the first frequency is greater than the second frequency.

20. The method of claim 18, wherein the second frequency is half of the first frequency.

* * * * *